United States Patent [19]

Tamura

[11] Patent Number: 4,866,396
[45] Date of Patent: Sep. 12, 1989

[54] TEMPERATURE STABILIZED RF DETECTOR

[75] Inventor: Yoshiharu Tamura, Tokyo, Japan

[73] Assignee: NEC Corporation, Japan

[21] Appl. No.: 212,194

[22] Filed: Jun. 27, 1988

[30] Foreign Application Priority Data

Jul. 2, 1987 [JP] Japan .................................. 62-166343

[51] Int. Cl.$^4$ .............................................. H03D 1/10
[52] U.S. Cl. ..................................... 329/352; 307/350; 307/317 R; 328/150; 329/370
[58] Field of Search .................... 329/204, 205 R, 206, 329/179; 455/337; 307/317 R, 317 A, 350, 503; 328/150

[56] References Cited

U.S. PATENT DOCUMENTS 4,319,196 3/1982 Kwan .................................. 329/204
4,523,155 6/1985 Walczak et al. ..................... 330/279

Primary Examiner—Siegfried H. Grimm
Attorney, Agent, or Firm—Laff, Whitesel, Conte & Saret

[57] ABSTRACT

A temperature stabilized RF detector has a first diode connected between an input terminal for receiving an RF signal and an output terminal for outputting the detection signal of the RF signal, and a second diode connected between the input terminal and a constant voltage source through a buffer circuit. Connecting directions of the first and second diodes are opposite to each other in a circuit for connecting the output terminal and the constant voltage source.

4 Claims, 1 Drawing Sheet

TEMPERATURE STABILIZED RF DETECTOR

Background of the Invention

The present invention relates to an RF (radio frequency) detector and, more particularly, to a temperature stabilized RF detector using a diode.

An RF detector utilizing the half-wave rectification function of a diode has been widely used.

As shown in the graph of voltage-current characteristics in FIG. 1, a diode does not allow a significant current to pass therethrough until a forward voltage reaches a voltage $V_1$ (e.g., 0.5 V). For this reason, in a conventional RF detector, a bias voltage $V_B$ near the voltage $V_1$ is applied to the diode to improve a detection sensitivity to a small signal.

Suppose that a detection voltage obtained by rectifying a high frequency signal by the diode is represented by $V_{DET}$, and a voltage drop across the terminals of the diode due to a current is represented by $V_X$, an output voltage $V_o$ is expressed as follows:

$$V_o = V_{DET} + V_B - V_X \qquad (1)$$

Since the voltage drop $V_X$ is given by a function of the current and temperature, if the bias voltage $V_B$ is constant, the output voltage $V_o$ also changes depending on the temperature. To compensate these changes in output voltage $V_o$ due to the temperature, another diode is coupled to a bias circuit which supplies the bias voltage $V_B$. Reference is made to U.S. Pat. No. 4,523,155 issued to Walczak et al, June 11, 1985. The RF detector circuit described in this patent does not, however, provide sufficient temperature compensation when an input RF signal is small.

SUMMARY OF THE INVENTION

It is an object of the present invention to provide a temperature stabilized RF detector which can provide desirable temperature characteristics for a small signal.

According to the present invention, a temperature stabilized RF detector for detecting an RF signal input at an RF input terminal and outputting a detection voltage from its detection voltage output terminal, comprises a constant voltage source for outputting a predetermined first voltage at a low output impedance, a first diode, an electrode of a first polarity which is connected to the constant voltage source and an electrode of a second polarity which is connected to a predetermined second voltage terminal through a resistor, a buffer circuit for outputting a voltage substantially equal to a voltage at the electrode of the second polarity of the first diode at a low output impedance, and a second diode, an electrode of the first polarity which is connected to the detection voltage output terminal, and an electrode of the second polarity which is connected to an output terminal of the buffer circuit and the RF input terminal.

DETAILED DESCRIPTION OF THE PREFERRED EMBODIMENT

An embodiment of the present invention will be described hereinafter in detail with reference to the accompanying drawings.

Figure 1:
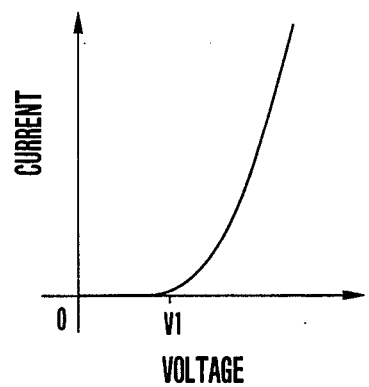
FIG. 1 is a graph showing the voltage-current characteristics of a diode.
Figure 2:
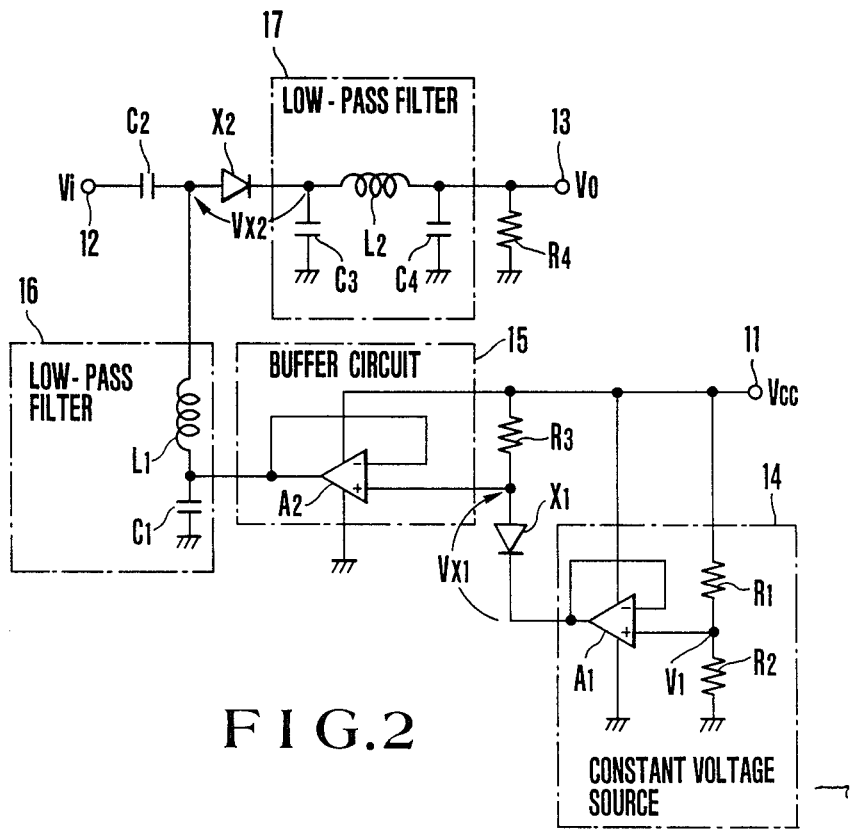
FIG. 2 is a circuit diagram showing an embodiment of the present invention.

In FIG. 2, reference numeral 11 denotes a power supply terminal of a power supply voltage $V_{cc}$; 12, an RF signal input terminal for receiving an RF signal of a voltage $V_i$; and 13, a detection voltage output terminal for outputting an RF detection signal of a detection voltage $V_o$.

The power supply terminal 11 is grounded through a series circuit of resistors $R_1$ and $R_2$. The node between the resistors $R_1$ and $R_2$ is connected to the non-inverting input terminal of an operational amplifier $A_1$. That is, a voltage appearing at the non-inverting input terminal of the operational amplifier $A_1$ is maintained at $V_1$ ($= V_{cc} \cdot R_2/(R_1 + R_2)$).

The inverting input terminal of the operational amplifier $A_1$ is directly connected to its output terminal. Since the output voltage is fed back to the inverting input terminal, even if the output current changes, the output voltage is maintained at a voltage $V_1$ input at the non-inverting input terminal. More specifically, the operational amplifier $A_1$ and resistors $R_1$ and $R_2$ constitute a constant voltage source 14 for outputting the voltage $V_1$ at a low output impedance.

The cathode of a diode $X_1$ is connected to the output terminal of the operational amplifier $A_1$. The anode of the diode $X_1$ is connected to the power supply terminal 11 through a resistor $R_3$, and to the non-inverting input terminal of an operational amplifier $A_2$.

The inverting input terminal of the operational amplifier $A_2$ is directly connected to its output terminal. Since the output voltage of the operational amplifier $A_2$ is fed back to its inverting input terminal, even if an output current changes, the output voltage can be maintained at a voltage input at its non-inverting input terminal. More specifically, the operational amplifier $A_2$ constitutes a buffer circuit 15 for outputting a voltage at the anode of the diode $X_1$ at a low output impedance.

The operational amplifiers $A_1$ and $A_2$ respectively have terminals connected to the power supply terminal 11, and grounded terminals.

The RF input terminal 12 is connected to one terminal of a capacitor $C_2$. The other terminal of the capacitor $C_2$ is grounded through a series circuit consisting of an inductor $L_1$ and a capacitor $C_1$, and is connected to the anode of a diode $X_2$. The series circuit of the inductor $L_1$ and the capacitor $C_1$ constitutes a low pass filter 16 for preventing the RF signal $V_i$ input from the input terminal 12 from flowing toward the operational amplifier $A_2$. The capacitor $C_2$ is a coupling capacitor for coupling the RF signal $V_i$ to the diode $X_2$ and separating the diode $X_2$ from the input terminal 12 in DC voltages.

The node between the inductor $L_1$ and the capacitor $C_1$ is connected to the output terminal of the operational amplifier $A_2$.

The cathode of the diode $X_2$ is connected to one terminal of each of a capacitor $C_3$ and an inductor $L_2$. The other terminal of the capacitor $C_3$ is grounded, and the other terminal of the inductor $L_2$ is connected to the output terminal 13.

One terminal of each of a capacitor $C_4$ and a resistor $R_4$ is connected to the output terminal 13. The other terminal of each of the capacitor $C_4$ and the resistor $R_4$ is grounded. The capacitors $C_3$ and $C_4$ and the inductor $L_2$ constitute a low pass filter 17 which prevents the high frequency signal $V_i$ from flowing toward the output terminal 13, and directly couples the diode $X_2$ to the output terminal 13. The resistor $R_4$ serves as a load resistor.

The operation of the detector shown in FIG. 2 will be described below.

A differential voltage between the power supply voltage $V_{cc}$ and the constant voltage $V_1$ is applied to the series circuit across the diode $X_1$ and the resistor $R_3$. The resistance of the resistor $R_3$ is adjusted so that a small forward current (to be described later) flows through the diode $X_1$. If a voltage drop of the diode $X_1$ is given b $V_{X1}$, its anode voltage is expressed by $V_1+V_{X1}$. This anode voltage is applied to the non-inverting input terminal of the operational amplifier $A_2$.

The output voltage from the operational amplifier $A_2$, i.e., $V_1+V_{X1}$, is applied to the anode of the diode $X_2$ through the inductor $L_1$.

If a voltage drop across the diode $X_2$ is given by $V_{X2}$, and a detection voltage obtained by rectifying the RF signal $V_i$ by the diode $X_2$ is given by $V_{DET2}$, the output voltage $V_o$ at the output terminal 13 is expressed as:

$$V_o = V_{DET2} + V_1 + V_{X1} - V_{X2} \quad (2)$$

That is, the voltage drop $V_{X1}$ across the diode $X_1$ has an opposite polarity to the voltage drop $V_{X2}$ across the diode $X_2$.

When the RF signal $V_i$ is a small signal, the voltage $V_1$ and the resistance of the resistor $R_3$ are set so that a current of the diode $X_2$ becomes equal to that of the diode $X_1$, and the detection sensitivity is improved. As a result of this setting, if the RF signal $V_i$ is a small signal, the voltage drops $V_{X1}$ and $V_{X2}$ become equal to each other as well as their temperature characteristics, and the output voltage $V_o$ is given by:

$$V_o = V_{DET2} + V_1 \quad (3)$$

Therefore, a change in output voltage $V_o$ due to a temperature can be removed.

Since the output impedances of the operational amplifiers $A_1$ and $A_2$ for respectively outputting the voltage $V_1$ and the voltage $(V_1+V_{X1})$ are small, even if currents of the diodes $X_1$ and $X_2$ change due to a change in temperature, a constant component $V_1$ of the bias voltage $(V_1+V_{X1})$ applied to the diode $X_2$ is not changed.

If the RF signal voltage $V_i$ is increased and the diodes $X_1$ and $X_2$ have different current values, the voltage drops $V_{X1}$ and $V_{X2}$ are not always equal to each other, and the temperature characteristics of terms $V_{X1}$ and $V_{X2}$ of the output voltage $V_o$ given by equation (2) do not always cancel each other. In this case, the detection voltage $V_{DET2}$ becomes sufficiently large, and a change in output voltage $V_o$ due to a change in temperature based on a change in $(V_{X1}-V_{X2})$ due to a change in temperature can be ignored.

As described above, an RF detector having desirable temperature stabilized characteristics even when the input signal voltage $V_i$ is small can be obtained.

The embodiment of the present invention has been described with reference to a case wherein the power supply voltage $V_{cc}$ is positive. However, when the power supply voltage is negative, the connection polarities of the diodes $X_1$ and $X_2$ can be inverted to be opposite to those illustrated in FIG. 2.

What is claimed is:

1. A temperature stabilized RF detector for detecting an RF signal input at an RF input terminal thereof and outputting a detection voltage from a detection voltage output terminal thereof, comprising:
   a constant voltage source for outputting a predetermined first voltage at a low output impedance;
   a first diode, an electrode of a first polarity of which is connected to said constant voltage source and an electrode of a second polarity of which is connected to a predetermined second voltage terminal through a resistor;
   a buffer circuit for outputting a voltage substantially equal to a voltage at said electrode of the second polarity of said first diode at a low output impedance; and
   a second diode, an electrode of the first polarity of which is connected to said detection voltage output terminal, and an electrode of the second polarity of which is connected to an output terminal of said buffer circuit and said RF input terminal.

2. A temperature stabilized RF detector comprising:
   a power supply voltage terminal;
   an input terminal for receiving an RF signal;
   an output terminal for outputting a detection voltage of the detected RF signal;
   a first diode, one terminal of which is connected to said input terminal, and the other terminal of which is connected to said output terminal through a low pass filter;
   a constant voltage source, connected to said power supply voltage terminal, for generating a predetermined first constant voltage;
   a resistor, one terminal of which is connected to said power supply voltage terminal;
   a second diode connected between a constant voltage output terminal of said constant voltage source and the other terminal of said resistor; and
   a buffer circuit interposed between the node between said resistor and said second diode and said input terminal,
   wherein connecting directions of said first and second diodes are opposite to each other in a circuit for connecting said output terminal and said constant voltage source.

3. A temperature stabilized RF detector according to claim 2, further comprising a low pass filter, connected to said input terminal and said buffer circuit, for preventing the RF signal from flowing from said input terminal to said buffer circuit.

4. A temperature stabilized RF detector according to claim 2, wherein a resistance of said resistor is set so that, when an RF signal voltage input from said input terminal is small, current values flowing through said first and second diodes are equal to each other, and when the current values of said first and second diodes are equal to each other, temperature characteristics of voltage drops across said first and second diodes are equal to each other.

* * * * *